United States Patent
Qawami et al.

(10) Patent No.: US 10,872,647 B2
(45) Date of Patent: *Dec. 22, 2020

(54) FLEXIBLE DLL (DELAY LOCKED LOOP) CALIBRATION

(71) Applicant: Intel Corporation, Santa Clara, CA (US)

(72) Inventors: Shekoufeh Qawami, El Dorado Hills, CA (US); Michael J. Allen, Folsom, CA (US); Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,658

(22) Filed: Aug. 12, 2019

(65) Prior Publication Data

US 2019/0362764 A1    Nov. 28, 2019

Related U.S. Application Data

(63) Continuation of application No. 14/998,185, filed on Dec. 26, 2015, now Pat. No. 10,381,055.

(51) Int. Cl.
*G11C 7/22* (2006.01)
*G11C 29/02* (2006.01)
(Continued)

(52) U.S. Cl.
CPC ............ *G11C 7/222* (2013.01); *G11C 29/022* (2013.01); *G11C 29/023* (2013.01);
(Continued)

(58) Field of Classification Search
CPC ..... G11C 7/222; G11C 29/022; G11C 29/023; G11C 29/12015; G11C 2207/2254
(Continued)

(56) References Cited

U.S. PATENT DOCUMENTS 6,934,201 B2    8/2005  Ware et al.
7,719,333 B2    5/2010  Yun et al.
(Continued)

OTHER PUBLICATIONS

Campbell ("Intel Shows off 3D Xpoint Memory in SSD-DIMM Form Factor", Internet Publication, Oct. 29, 2015). Retrieved May 11, 2020 from https://www.overclock3d.net/news/memory/intel_shows_off_3d_xpoint_memory_in_ssd-dimm_form_factor/1 (Year: 2015).*

(Continued)

*Primary Examiner* — Mushfique Siddique
(74) *Attorney, Agent, or Firm* — Compass IP Law PC

(57) ABSTRACT

A memory device performs DLL (delay locked loop) calibration in accordance with a DLL calibration mode configured for the memory device. A host controller can configure the calibration mode based on operating conditions for the memory device. The memory device includes an input/output (I/O) interface circuit and a delay locked loop (DLL) circuit coupled to control I/O timing of the I/O interface. A control circuit of the memory device selectively enables and disables DLL calibration in accordance with the DLL calibration mode. When selectively enabled, the DLL calibration is to operate at a time interval identified by the DLL calibration mode, and when selectively disabled, the DLL calibration is to cease or refrain from DLL calibration operations.

18 Claims, 7 Drawing Sheets

(51) Int. Cl.
*G11C 29/12* (2006.01)
*G06F 13/16* (2006.01)

(52) U.S. Cl.
CPC .... *G11C 29/1201* (2013.01); *G11C 29/12015* (2013.01); *G06F 13/1689* (2013.01); *G11C 2207/2254* (2013.01); *Y02D 10/00* (2018.01)

(58) Field of Classification Search
USPC .......................................................... 365/191
See application file for complete search history.

(56) References Cited

U.S. PATENT DOCUMENTS

| | | | |
|---|---|---|---|
| 7,728,638 B2 | 6/2010 | Varricchione | |
| 7,839,159 B2 | 11/2010 | Nakamura et al. | |
| 8,307,270 B2 | 11/2012 | Kim et al. | |
| 8,760,901 B2 | 6/2014 | Riho | |
| 8,918,667 B2* | 12/2014 | Ware | G11C 11/4076 713/400 |
| 9,396,789 B2* | 7/2016 | Iwasaki | G06F 13/42 |
| 9,536,589 B2* | 1/2017 | Zerbe | G11C 7/222 |
| 10,331,193 B2* | 6/2019 | Ware | G06F 1/3234 |
| 10,381,055 B2* | 8/2019 | Qawami | G11C 29/12015 |
| 10,409,320 B2* | 9/2019 | Chang | G06F 1/08 |
| 2007/0086268 A1 | 4/2007 | Shaeffer et al. | |
| 2007/0153588 A1 | 7/2007 | Janzen | |
| 2007/0197181 A1 | 8/2007 | Yang et al. | |
| 2008/0246520 A1 | 10/2008 | Ma et al. | |
| 2008/0253214 A1 | 10/2008 | Stimak et al. | |
| 2009/0040838 A1 | 2/2009 | Choi | |
| 2011/0055671 A1 | 3/2011 | Kim et al. | |
| 2011/0235459 A1 | 9/2011 | Ware et al. | |
| 2011/0239063 A1 | 9/2011 | Zerbe et al. | |
| 2012/0089854 A1 | 4/2012 | Breakstone et al. | |
| 2014/0139277 A1 | 5/2014 | Subramanian et al. | |
| 2014/0362653 A1 | 12/2014 | Iwasaki | |
| 2015/0131395 A1* | 5/2015 | Ishikawa | G11C 11/406 365/222 |
| 2015/0364182 A1 | 12/2015 | Tewalt | |
| 2016/0048334 A1 | 2/2016 | Jeter | |
| 2019/0187744 A1* | 6/2019 | Chang | G11C 5/04 |

OTHER PUBLICATIONS

Extended European Search Report for Patent Application No. 16879804.9, dated Jun. 27, 2019, 8 pages.
Final Office Action for U.S. Appl. No. 14/998,185, dated Jun. 14, 2018, 24 pages.
Gigabyte-Motherboard-Socket 775 component information, retrieved from http://www.gigabyte.us/products/list.aspx?s=42&jid=7&p=2&v=7, retrieved on Jul. 12, 2016. 6 pages.
International Preliminary Report on Patentability for PCT Patent Application No. PCT/US16/63687, dated Jul. 5, 2018, 10 pages.
International Search Report and Written Opinion for PCT Patent Application No. PCT/US2016/063687, dated Mar. 9, 2017, 13 pages.
JED EC 21-C 4.01.02 04 R13—Appx X—SPD for DOR, Jan. 2004. 39 pages.
JEDEC JESD79-4, Sep. 2012. 214 pages.
Notice of Allowance for U.S. Appl. No. 14/998,185, dated Apr. 1, 2019, 8 pages.
U.S. Appl. No. 14/670,411, filed Mar. 27, 2015, 35 pages.
European First Office Action for Patent Application No. 16879804.9, dated Jun. 23, 2020, 6 pages.
Taiwanese and English Translation of Search Report of R.O.C. for Patent Application No. 105138631, dated Jun. 1, 2020, 2 pages.

* cited by examiner

MODE REGISTER (MRx) 410

| ADDRESS | OPERATING MODE | DESCRIPTION |
|---|---|---|
| AZ | CONTROL BIT FOR HOST INITIATED DLL CALIBRATION MODE | 0 => STOP DLL CALIBRATION* <br> 1 => START DLL CALIBRATION* <br> *ONLY VALID WHEN AY[1:0] ENABLES HOST INITIATED CALIBRATION |
| AY[1:0] | DLL CALIBRATION MODES | 00 => ZQCAL RUNS DLL CALIBRATION <br> 01 => CONTINUE DLL TRACKING DURING ACTIVE AND IDLE MODES; DLL OFF DURING LOW POWER MODES <br> 10 => HOST INITIATED DLL CALIBRATION. CALIBRATION STARTED OR STOPPED BY SETTING BIT AZ (0=STOP, 1=START) <br> 11 => CONTINUE DLL TRACKING DURING ACTIVE, IDLE MODES, AND LOW POWER MODES |

FIG. 4

FLEXIBLE DLL (DELAY LOCKED LOOP) CALIBRATION

PRIORITY

This application is a Continuation of, and claims the benefit of priority of, U.S. patent application Ser. No. 14/998,185, filed Dec. 26, 2015, now U.S. Pat. No. 10,381,055.

FIELD

The descriptions are generally related to input/output (I/O) circuits, and more particular descriptions are related to flexible DLL (delay locked loop) calibration for I/O circuits.

BACKGROUND

Synchronous memory performs access operations based on a clock signal as a timing reference to enable the transmission and reception of data with a known relationship to the reference. I/O (input/output) interfaces for synchronous interconnections commonly use a DLL (delay locked loop) to maintain the known relationship with respect to the reference timing. DLL circuits adjust the timing of internal signals to align with the timing reference. Synchronous operation can improve signaling between connected devices. However, DLL operation traditionally involves continuous tracking of the reference timing signal when the DLL is active, which consumes a significant amount of power. DLL tracking can be referred to as DLL calibration, which the phase control is calibrated to the external reference timing. The power consumption of continuous DLL calibration can consume a significant portion of the overall power budget in systems designed to operate in low power modes.

It will be understood that depending on the application of the memory device, the signaling speed can be lower or higher. For lower power applications, typically the signaling speeds are lower. The DLL timing compensation adjusts timing characteristics that affect a data "eye" that identifies a threshold for signaling by the memory device. Continuous DLL tracking maintains narrow margins on the data eye. Lower speed signaling can tolerate higher variance in the margins of the data eye, and DLL calibration may not be required in some implementations. Higher speed signaling may require continuous DLL calibration to ensure the data eye margins required for higher speed operation. Traditionally, manufacturers and system designers either have DLL calibration continuously operating when the DLL is active, or do not include it.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is a block diagram of an embodiment of a mode register to selectively enable DLL calibration modes.

Figure 1:
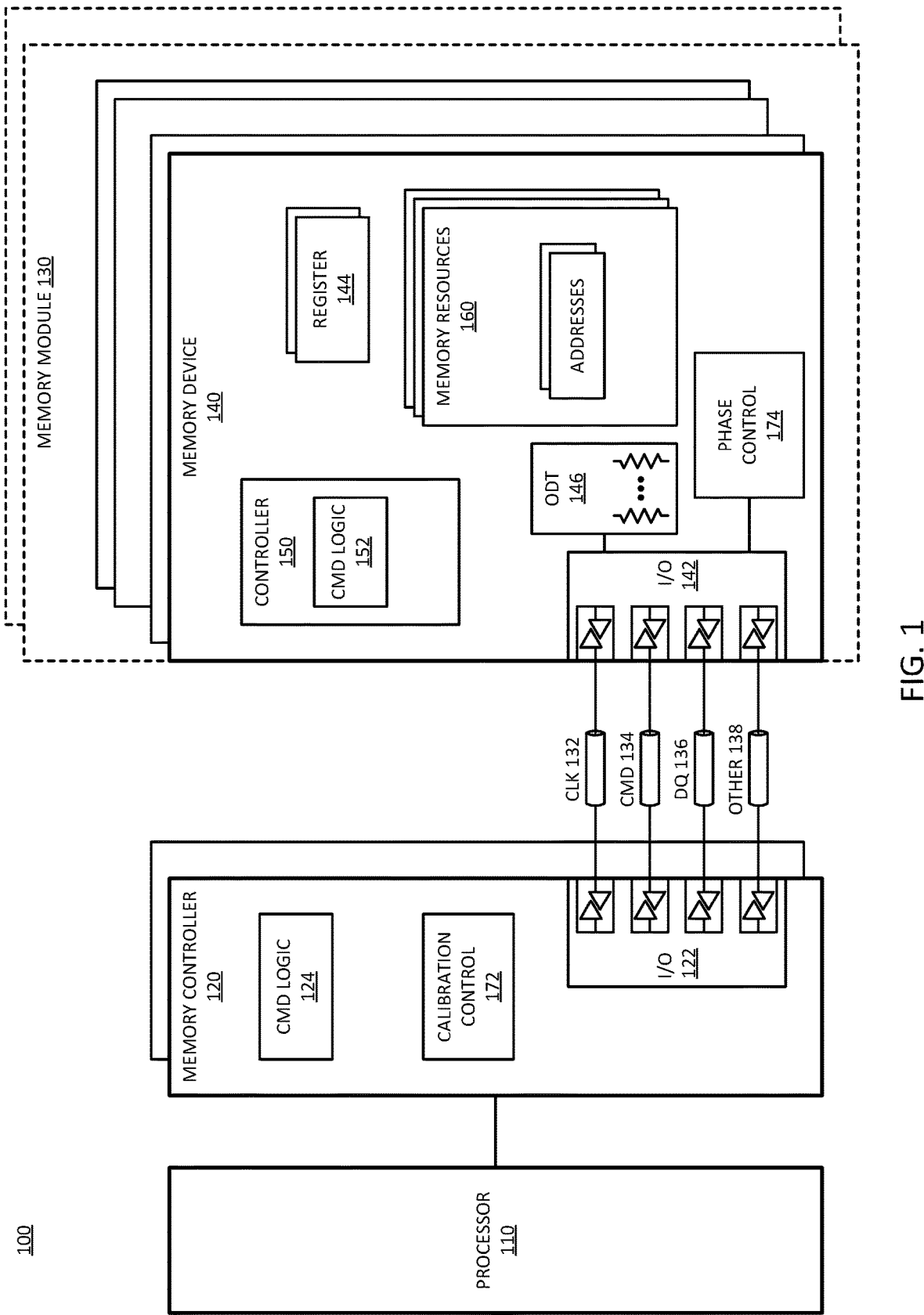
FIG. 1 is a block diagram of an embodiment of a system in which memory device I/O phase control can be selectively calibrated.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory device performs DLL (delay locked loop) calibration in accordance with a DLL calibration mode configured for the memory device. Different DLL calibration modes provides flexibility in being able to turn DLL calibration on and off to achieve a balance between power consumption and timing margins for I/O (input/output) signaling. The DLL calibration modes can include modes for always-on operation as with traditional systems, and can allow periods where DLL calibration is turned off.

A host controller can configure the calibration mode based on operating conditions for the memory device. The memory device includes an input/output (I/O) interface circuit and a delay locked loop (DLL) circuit coupled to control I/O timing of the I/O interface. A control circuit of the memory device selectively enables and disables DLL calibration in accordance with the DLL calibration mode. When selectively enabled, the DLL calibration can operate at a time interval identified by the DLL calibration mode, and when selectively disabled, the DLL calibration is to cease DLL calibration operations. Thus, system can provide flexible DLL calibration for different operating conditions.

Reference to memory devices can apply to different memory types. In one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include nonvolatile devices, such as a three dimensional crosspoint (3D Xpoint or 3DXP) memory device, other byte addressable nonvolatile memory devices, or memory devices that use chalcogenide phase change material. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. Thus, reference to a memory device can refer to a nonvolatile memory device that supports random access, and/or is configured for synchronous I/O.

In one embodiment, a memory device refers to volatile memory technologies. Volatile memory is memory whose state (and therefore the data stored on it) is indeterminate if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), and/or others, and technologies based on derivatives or extensions of such specifications.

Descriptions herein referring to a "DRAM" can apply to any memory device that allows random access, whether volatile or nonvolatile. The memory device or DRAM can refer to the die itself and/or to a packaged memory product.

As a non-limiting example of flexible DLL calibration described herein, consider a memory device built on 3DXP technology. 3DXP technology is being developed and is expected to find use in computing platforms that have diverse requirements with respect to bandwidth and storage capacity. Some implementations will require faster access to a 3DXP memory, while others may require lower pin counts. 3DXP technology enables the development of a memory device that is nonvolatile, and supports random access. Certain implementations can provide access speeds that are comparable to traditional DRAM speeds, rather than traditional nonvolatile technologies such as a NAND flash.

In one embodiment, 3DXP devices can be synchronous and receive and operate based on a clock signal as a timing reference for data exchange (transmitting and/or receiving data). In synchronous operation, data can be transmitted and received with a known relationship to the reference signal. Seeing that 3DXP technology supports different implementations, it may be deployed in systems that require higher frequency access, or in systems that only need lower frequency access. As with traditional memory technologies, in high frequency operation 3DXP memory devices will need to maintain the clock to data signal relationship when there are process, voltage, and temperature (PVT) variations. Typically PVT variations result in reduced timing margins.

In one embodiment, a 3DXP device includes a DLL to maintain a consistent timing relationship between a clock signal and output data signals in environments where process, voltage, and temperature variations cause these relationships to change over time, even in higher speed operation. Although a DLL improves the frequency of operation by maintaining a constant relationship between clock and data signaling, every time it calibrates the clock and datapath periodically, it consumes a large amount of power. In one embodiment, certain implementations of a 3DXP device will have lower access speeds and can tolerate more variation in data transfer timing, and thus do not require DLL calibration.

As stated above, 3DXP technology is a non-limiting example, and other memory device technologies also experience the tradeoffs of using a DLL to maintain a consistent relationship between the timing reference and the data versus the large amount of power used to calibrate the DLL. Similarly, there are other memory technologies that might have different implementations where timing margins are not a concern and other implementations where variation in timing margins based on operating condition variations can cause signaling errors. With either 3DXP technology or other memory technologies, there may be lower power system implementations where relaxed timing margins do not require the continuous use of DLL calibration.

The different DLL calibration modes enable setting different calibration periods based on the system needs. As described below, there are four primary calibration modes described, which will be understood to be non-limiting. Other calibration modes are possible, and the flexibility to apply different modes will be understood to be similar with different calibration mode configurations. The calibration modes provide system flexibility to trade off performance for power based on DLL operation. Different calibration modes enable modification of a memory device interface to vary how often DLL calibration is performed. Such flexibility allows a system designer to choose between high-frequency, high-power operation and low-frequency, low-power operation instead of continuous DLL calibration that consumes significant amount of power in low frequency, low power applications. Additionally, it enables occasional DLL calibration in low frequency, low power applications instead of simply disabling DLL operation altogether with traditional implementations.

FIG. 1 is a block diagram of an embodiment of a system in which memory device I/O phase control can be selectively calibrated. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC, or be implemented with standalone components.

Memory controller 120 represents one or more host controller or memory controller circuits or devices for system 100. Memory controller 120 represents control logic that generates memory access commands in response to the execution of operations by processor 110 and/or otherwise enables memory access in system 100. Memory controller 120 accesses one or more memory devices 140. In one embodiment, memory device 140 represents a three-dimensional stacked memory device. In one embodiment, memory device 140 represents a 3D crosspoint memory device, or other nonvolatile memory device. In one embodiment, memory device 140 can be a DRAM in accordance with any referred to above. In one embodiment, memory devices 140 are organized and managed as different channels, where each channel couples to buses and signal lines that couple to multiple memory devices in parallel. Where channels are used, each channel can be independently operable. Thus, each channel is independently accessed and controlled, and the timing, data transfer, command and address exchanges, and other operations are separate for each channel. In one embodiment, settings for each channel are controlled by separate mode register or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O 142 of memory device 140) can include pins, connectors, signal lines, and/or other hardware to connect the devices. I/O interface logic 122 can include a hardware interface. As illustrated, I/O interface logic 122 includes at least drivers/transceivers for signal lines. Typically, wires within an integrated circuit interface with a pad or connector to interface to signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. In one embodiment, the system bus includes at least clock (CLK) 132, command/address (CMD) 134, data (DQ) 136, and other signal lines 138. The signal lines for CMD 134 can be referred to as a "C/A bus" (or ADD/CMD bus, or some other designation indicating the transfer of commands and address information) and the signal lines for DQ 136 be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

In one embodiment, the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die. In one embodiment, each memory device 140 can include multiple (e.g., 2) channels per die. Each memory device 140 includes I/O interface logic 142, which has a bandwidth determined by the implementation of the device (e.g., x16 or x8 or some other interface bandwidth), and enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. In one embodiment, memory resources 160 are managed as rows of data, accessed via cacheline (rows) and bitline (individual bits within a row) control. In one embodiment, memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry for the sub-banks. In one embodiment, other organizations of memory resource storage locations can be used. However organized, memory resources 160 are accessible via address information, as generically illustrated as "addresses."

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include Mode Registers. In one embodiment, registers 144 include multipurpose registers. The configuration of locations within register 144 can configure memory device 140 to operate in different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the access and/or execution of operations for memory resources 160 based on the selected mode. Controller 150 generates control signals to control the routing of bits within memory device 140 to provide a proper interface or I/O 142 for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications, including timing margins for I/O signaling.

In one embodiment, memory device 140 includes phase control 174 to control the phase or other timing characteristics of I/O 142. Thus, phase control 174 enables memory device 140 to adjust phase to synchronize DQ 136 with clock 132, for example. In one embodiment, at least a portion of the logic or circuitry of phase control 174 is part of controller 150. In one embodiment, phase control 174 includes a DLL. DLL can operate to maintain timing margins for I/O 142, and can be synchronized in accordance with one or more calibration modes.

In one embodiment, memory controller 120 includes calibration control 172, which represents circuitry/logic within the memory controller to provide calibration settings to memory device 140 for timing synchronization. In one embodiment, calibration control 172 enables memory controller 120 to set a DLL calibration mode configuration for memory device 140. The calibration mode configuration set by calibration control 172 can affect how phase control 174 of memory device 140 operates. In one embodiment, calibration control 172 programs one or more multipurpose registers 144 or other registers to store configuration for the calibration mode. Such a multipurpose register can enable configurability for DLL calibration timing within memory 140. In one embodiment, calibration control 172 determines an operating condition of memory device 140, such as a configuration of system 100, an environmental condition (e.g., voltage, noise, temperature), and/or other condition. In one embodiment, calibration control 172 enables memory controller 120 to perform one or more test operations on memory device 140 to determine process variations or other conditions that can set I/O data eye margins or other signaling characteristics.

Phase control 174 can perform DLL calibration more frequently or less frequently, depending on the DLL calibration mode set by calibration control 172. In one embodiment, memory device 140 includes sensors (not specifically shown) that provide environmental condition information to memory controller 120, which can be used by calibration control 172 to set a calibration mode.

Figure 2:
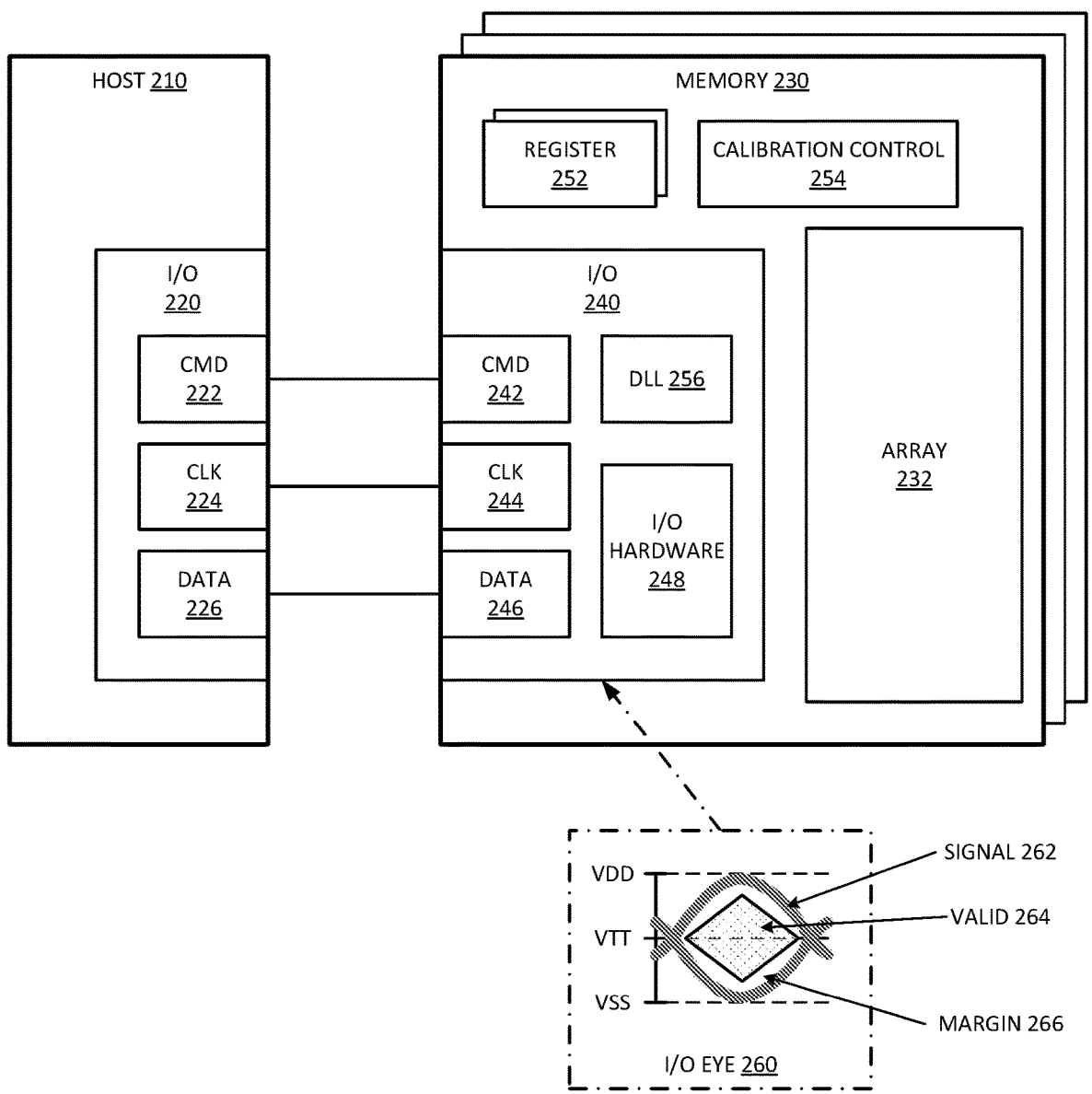
FIG. 2 is a block diagram of an embodiment of a system in which a memory device includes configurable DLL calibration modes.

FIG. 2 is a block diagram of an embodiment of a system in which a memory device includes configurable DLL calibration modes. System 200 represents components of a memory subsystem. System 200 provides one example of a memory subsystem in accordance with an embodiment of system 100 of FIG. 1. System 200 can be included in any type of computing device or electronic circuit that uses memory with DLL control of I/O timing. Host 210 represents control circuitry for system 200. Host 210 can include a processor and a memory or storage controller. A processor of host 210 can include any type of processing logic or component that executes operations based on data stored in memory 230 or to store in memory 230. Host 210 can include a host processor, central processing unit (CPU), microcontroller or microprocessor, graphics processor, peripheral processor, application specific processor, or other processor. Host 210 can be or include a single core or multicore circuit. Host executes an operating system (OS) that controls the flow of execution for a computing device or a portion of a computing device into which system 200 is incorporated.

Host 210 includes (either as part of the same circuit as the processor or as part of a separate circuit), a controller that enables access to memory 230. In one embodiment, system 200 is a system in which a processor and a memory device are integrated onto the same substrate or PCB. Host 210 includes I/O 220, which represents interface hardware to couple to memory 230. For purposes of illustration in system 200, I/O 220 includes command interface 222, clock or timing reference 224, and data 226. Memory 230 includes I/O 240 with corresponding interface hardware command 242, clock 244, and data 246. It will be understood that other interfaces can be included. In one embodiment, command interface 222 includes a command/address bus. In one embodiment, data 226 includes a data bus separate from a command/address bus of command interface 222. In one embodiment, command interface 222, clock 224, and data 226 can be considered part of the same bus. For example, in certain nonvolatile memory technologies (such as NAND memories), such signal lines may be considered combined in a single bus. Host 210 is communicatively coupled to memory 230 via the interface of I/O 220 to I/O 240. Host 210 accesses memory 230 via the interface.

Memory 230 includes array 232, which represents the storage locations within memory 230 where data is stored. Array 232 can include any number of storage locations and memory 230 includes interface hardware (not explicitly shown) to access the various addressable storage locations within array 232. Command 242 receives a command from host 210, which an internal controller of memory 230 (not explicitly shown) decodes to cause access to the appropriate storage location(s) of array 232. In one embodiment, array 232 is an array of nonvolatile storage cells, and memory 230 is a three-dimensional stacked memory device having random access capability.

In one embodiment, I/O 242 includes I/O hardware 248, which can include drivers, termination, receivers, routing hardware, and/or other components to interface array 232 to data interface 246 based on command 242 and clock 244. For a write operation, data is received over data 246 to write to array 232. For a read operation data is sent over data 246 to host 210. In one embodiment, I/O hardware 248 includes one or more buffers to enable a burst of access.

In one embodiment, I/O 240 includes DLL 256, which represents a phase control mechanism that can control the timing of operations of I/O hardware 248. DLL 256 in turn operates based on one or more settings in register 252. In one embodiment, calibration control 254 controls how frequently to calibrate the operation of DLL 256 (e.g., any range from no calibration to continuous calibration) based on a DLL calibration mode configured in register 252. By enabling multiple configuration modes with register 252, calibration control 254 can provide more flexibility to perform DLL calibration at any time interval needed to operate memory 230 correctly, or at any time interval needed to enable appropriate synchronization of data 246 via DLL 256.

In one embodiment, host 210 configures register 252 for DLL calibration, to selectively enable and disable DLL calibration. In one embodiment, DLL 256 controls I/O eye 260, which can represent a signaling "eye" at data interface 246. I/O eye 260 will be understood to be a non-limiting example, and represents signaling between the voltage rails (VDD and VSS). The voltage rails refer to high and low voltage references, where VDD is a high voltage reference for signaling, and VSS is a low voltage signaling reference. In one embodiment, memory 230 includes a VTT reference, which can be between VDD and VSS, and can be used for termination and/or other signaling characteristics. VTT is not necessarily present in all examples of memory 230. Signal 262 represents the "data eye," which is an approximation of many different I/O signals, or a composite signal of many different signals sent and/or received over time. The approximation of composite signal 262 provides an opening within the signals, where a valid signal 264 illustrates an approximation of voltage levels and timing that should guarantee that an I/O signal will be properly interpreted.

Typically, the valid region 264 is set by standard or agreement and/or by training. Space between signal 262 and valid region 264 is margin 266. Margin 266 indicates how much variation can occur in signal 262 while still complying with timing/voltage requirements for a valid signal. Sometimes expressions such as "margin" and "margining" can refer to determining what settings should be used to cause signal 262 to achieve valid eye 264, and/or to setting the configurations of I/O to achieve such signaling that is valid. DLL 256 can control timing of signals exchanged (e.g., sent and/or received) via data 246 to ensure a valid I/O eye 260. In one embodiment, calibration control 254 refers to control logic between register 252 and DLL 256 and/or other I/O hardware 248 to control the calibration of DLL 256.

In one embodiment, if memory 230 is deployed in a "nonvolatile storage" application, calibration control 254 can infrequently perform or perhaps not perform DLL calibration. In storage applications, the speeds of signaling can be slower, and margin 266 may be large enough that regular DLL calibration is not needed. In one embodiment, if memory 230 is deployed as a main memory replacement, calibration control 254 can more frequently perform or continuously perform DLL calibration or DLL tracking. In "main memory" applications, the speeds are signaling are faster, and margin 266 may be much smaller and need more frequent DLL calibration operations.

In one embodiment, based on one or more operating conditions, such as the environmental conditions of the computing device of system 200, or the power source for system 200. Varying conditions can affect the voltage rails, introducing voltage variations in the rails and/or introducing noise into the supply lines of either rail. In one embodiment, calibration control 254 can selectively turn calibration on and off in accordance with a DLL calibration mode set in register 252. It will be understood that turning off the DLL calibration can result in a delay of approximately a few microseconds each time the calibration is turned off and then switched back on. In one embodiment, host 210 can determine when there is noise on the power for a particular memory 230 and/or other variation in system 200, and set a DLL calibration mode based on the conditions of the memory. In one embodiment, the host sets a calibration mode based on the configuration of the system, such as whether memory 230 is configured for high speed access or low speed access.

Figure 3:
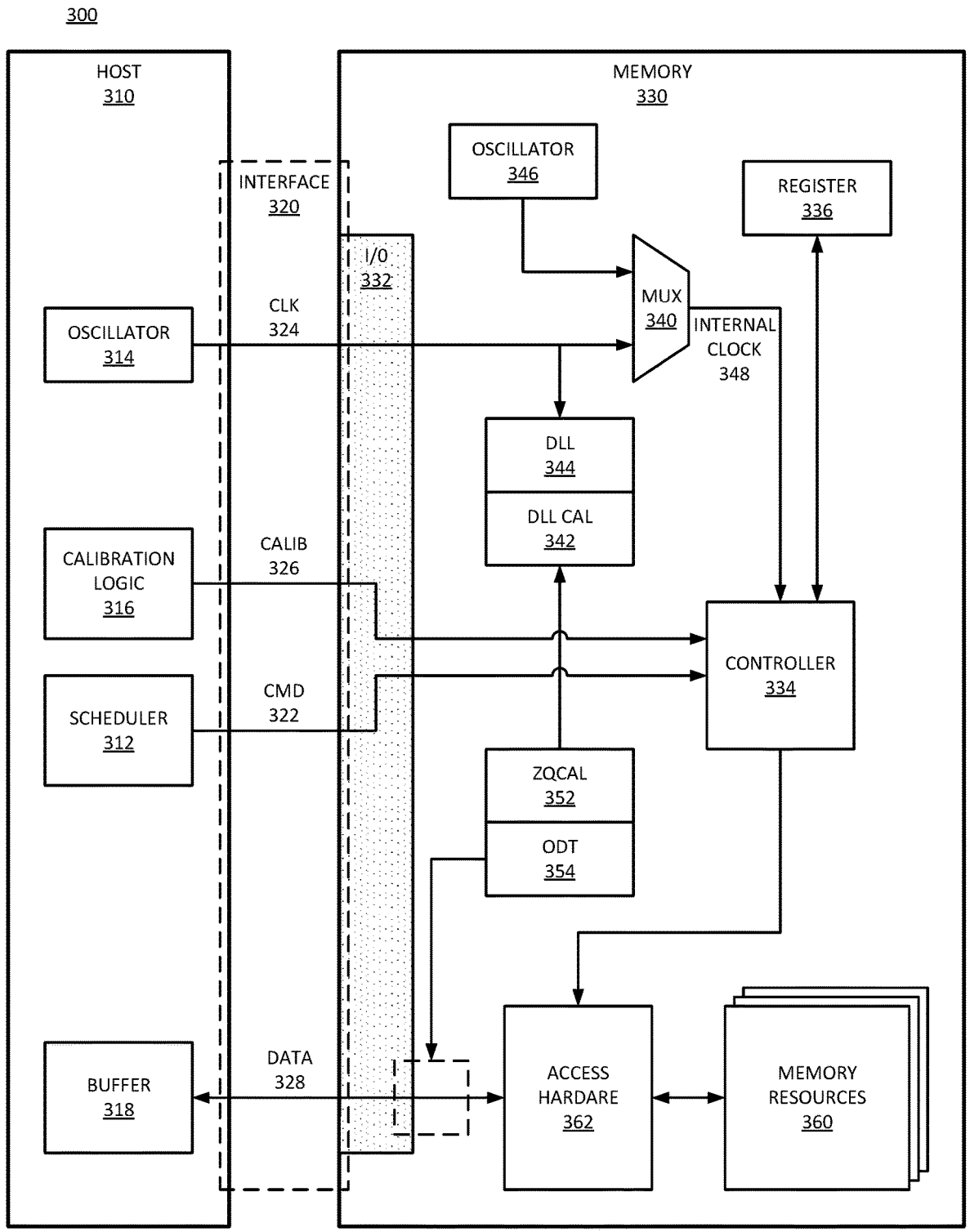
FIG. 3 is a block diagram of an embodiment of a system in which DLL calibration modes for a memory device can be applied.

FIG. 3 is a block diagram of an embodiment of a system in which DLL calibration modes for a memory device can be applied. System 300 represents elements of a memory system, and provides an example of a system in accordance with an embodiment of system 100 and/or an embodiment of system 200. System 300 includes host 310 and memory 330. Host 310 is communicatively coupled with memory 330 over interface 320. Interface 320 can include point to point connections, multi-drop bus connections, routed signal lines, I/O hardware (similar to what is described above), and/or other mechanism to enable one device to communicate with the other. I/O 332 represents an I/O interface of memory 330. While not explicitly shown, it will be understood that host 310 also includes an I/O interface, and interface 320 represents the interconnection of those two I/O interfaces. I/O 332 can include I/O hardware as previously described. I/O 332 does not necessarily show all connections that would exist between host 310 and memory 330.

In one embodiment, host 310 includes scheduler 312, which represents control logic that determines what commands to send to what memory device, and when. In response to execution by a host processor (not specifically shown), the scheduler can generate commands to send to memory 330 to access data that is not stored in local cache or a local buffer. The data can include commands and/or values. Scheduler 312 provides command 322 (which can include address information) over interface 320 to memory 330. In one embodiment, internal controller 334 receives and decodes the command data. Such command data can include mode register set (MRS) commands to set a mode register or a multipurpose register of a mode register. Such command data can include access commands. Such command data can include calibration commands, although for purposes of illustration in system 300, a separate calibration pathway is illustrated. Controller 334 directs operations in memory 330 based on the received commands from host 310.

In one embodiment, memory 330 is synchronous, and synchronizes to received clock signal 324 via interface 320. Host 310 includes one or more oscillators 314, which represent hardware that generates a periodic signal used to control the timing of operations in host 310. In one embodiment, host 310 provides clock signal 324 based on oscillator 314. It will be understood that clock signal 324 is not necessarily a direct output of oscillator 314, but can be filtered, conditioned, or otherwise modified before being sent to memory 330.

In one embodiment, memory 330 includes internal oscillator 346, which memory 330 can use in certain operations asynchronously from host 310 (such as certain low power operations). Not every implementation of memory 330 will include internal oscillator 346. Oscillator 346 does not necessarily operate at the same nominal frequency of oscillator 314, although they may. Oscillator 346 enables memory 330 to generate an internal clock signal for operations where it does not use external clock 324. In one embodiment where memory 330 includes oscillator 346, memory 330 may include a selection mechanism (such as multiplexer 340) to select between internal or externa clock signals. Whether from an internal oscillator or synchronized to an external clock signal, memory 330 includes internal clock 348 to define the timing of operations within memory 330.

In one embodiment, memory 330 includes DLL 344 to control the timing or phase of data I/O 328 based on clock signal 324, based on a feedback loop as is understood in the art. Traditionally, when DLL 344 is active, it will continuously track the phase of data I/O 328 versus clock 324, and adjust the output based on the clock signal. The continuous tracking refers to DLL calibration that can consume a significant amount of power. For purposes of illustration, DLL calibration (CAL) 342 is illustrated next to DLL 344. DLL calibration 342 represents logic that can control the calibration operation of DLL 344. In one embodiment, DLL calibration 342 can be considered to be part of controller 334. Controller 334 is not necessarily a single logic circuit, but can include distributed control logic within memory 330.

Memory 330 includes memory resources 360, which represent the storage cells or memory locations that store data in memory 330. Memory resources can be in accordance with an embodiment of a memory technology as described above. Memory 330 includes access hardware 362 to interface with and control access to data stored in memory resources 360. For a write operation, access hardware 362 can select the addressed location(s) and set the addressed location(s) with the data to be written. For a read operation, access hardware 362 can select the addressed location(s) and read the data stored in the addressed location(s).

Access hardware 362 interfaces memory resources 360 with a data bus for data I/O 328 of interface 320. Access hardware 362 can enable an interconnection between one or more buffers 318 of host 310 and memory resources 360. In one embodiment, access hardware 362 includes one or more buffers. Buffer 318 can represent a temporary queue for data to be written to memory resources 360 for a write transaction, or a temporary queue to store data received from memory resources 360 in a read transaction. Host 310 can fill or empty buffer 318 in accordance with commands provided by scheduler 312.

In one embodiment, memory 330 includes ODT (on-die termination) 354. In one embodiment, system 300 includes off-chip termination for memory 330, which can provide I/O impedances via connection to connectors of I/O 332 that are not shown. Whether external impedance or ODT 354, memory 330 can provide specific I/O impedance for data exchanged over data interface 328. While the dashed box is shown for illustration, in one embodiment, the termination can be considered to be "part" of I/O 332. The termination impedance is applied as part of the interface to provide a certain impedance when looking into I/O 332 from the perspective of host 310.

In one embodiment, controller 334 and/or DLL calibration 342 perform calibration in accordance with a DLL calibration mode setting stored in register 336. In one embodiment, there are several distinct DLL calibration modes possible. The modes can include a mode in which DLL calibration 342 operates continuously when memory 330 is in an active state, and is off when memory 330 is in a low power state. The modes can include a mode in which DLL calibration 342 operates continuously whether memory 330 is in an active or low power state, which is comparable to traditional DLL calibration operation. The modes can include a host initiated calibration mode, where host 310 provides explicit DLL calibration commands to memory 330. Such a mode can be represented by calibration logic 316, which provides calibration command 326 to memory 330. In one embodiment, calibration logic 316 represents logic to determine and set the selected DLL calibration mode, such as determine an operating state of memory 330 and setting the DLL calibration mode based on the operating state. Thus, calibration command 326 can represent a command to set the calibration mode.

It will be understood that selectively setting the operation of DLL calibration on or off can occur at runtime in system 300. Thus, rather than being a system that includes a fused setting for DLL operation, DLL calibration 342 is dynamically configurable, and can be changed, even at runtime. In one embodiment, the DLL configuration mode is set on each initialization or power up of system 300. In one embodiment, host 310 periodically determines whether to update the DLL calibration mode. In one embodiment host 310 determines to update the DLL calibration mode in response to detecting certain conditions, such as receiving an interrupt, receiving an operating condition indication from memory 330, or other detection. The selected calibration mode determines a time interval for operation by DLL calibration 342. Thus, DLL calibration 342 will operate at a time interval identified by the calibration mode.

In one embodiment, the DLL calibration modes can include a DLL calibration mode in which DLL calibration occurs in conjunction with ZQCal operation. ZQCal refers to impedance calibration. In one embodiment, memory 330 includes ZQCal 352. In one embodiment, memory 330 only includes ZQCal 352 in an embodiment where it also includes ODT 354. In one embodiment, ZQCal 352 includes one or more configuration settings in a register 336. For example, one or more mode registers may store configuration settings that control a schedule of when ZQCal operations are executed.

ZQCal operations can refer to operation by a ZQCal engine that performs various I/O operations and measures timing and signaling characteristics to determine settings that achieve a desired I/O characteristic. ZQCal 352 can represent the ZQCal engine. Similarly, DLL calibration 342 can be thought of as a DLL calibration engine that perform various I/O operations at different settings to determine what settings achieve desired I/O margins and/or other timing constraints and/or I/O eye characteristic. In one embodiment, each time ZQCal 352 performs impedance calibration, DLL calibration 342 performs DLL calibration.

FIG. 4 is a block diagram of an embodiment of a mode register to selectively enable DLL calibration modes. Mode register (MRx) 410 represents an example of a mode register in a DRAM or other memory device that supports different DLL calibration modes. In one embodiment, what is illustrated as mode register 410 can be multiple separate mode registers. As illustrated, address AY[1:0] represents bits that set a specific DLL calibration mode. The example shown in mode register 410 is consistent with other examples provided herein, and illustrates a non-limiting example. More or fewer DLL calibration modes can be used, and different bit patterns can be used to represent different DLL calibration modes.

In one embodiment, when AY[1:0]='00', DLL calibration operation is connected to ZQCal operation. Thus, when ZQCal operations occur (which can be in response to a command from the host), the memory device also performs DLL calibration. In one embodiment, DLL calibration defaults to running with ZQCal. In one embodiment, when AY[1:0]='01', DLL calibration continues DLL tracking during active and idle modes, and the DLL is off during low power modes. In one embodiment, when AY[1:0]='11', DLL calibration continues DLL tracking during active modes, idle modes, and low power modes. Having DLL calibration track during low power modes increases power consumption, but results in less delay when coming out of low power modes. In one embodiment, when AY[1:0]='10', DLL calibration operation is controlled by explicit command from the host. Host initiated DL calibration indicates that DLL calibration is started or stopped by a command or by setting a mode register bit AZ, where '0' stops calibration and '1' starts calibration.

Address AZ represents a bit that triggers DLL calibration operation in host initiated DLL calibration mode. In one embodiment, address AZ can be in a different mode register from the mode register that holds the bit or bits that set the DLL calibration mode. In one embodiment, control bit AZ='0' stops DLL calibration, and control bit AZ='1' starts DLL calibration. In one embodiment, when the DLL calibration mode is not set to host initiated calibration mode, the memory device ignores AZ, and its value has no effect on operation.

It will be understood that host initiated calibration mode may require the host to perform a characterization of the board or environment of the system in which the memory is deployed. Whereas ZQCal typically responds only to temperature fluctuations and so can be executed every few hundreds of milliseconds, DLL can be affected by a broader range of conditions than temperature. DLL operation can be impacted by noise, which could require a host to monitor power supply noise in addition to system temperature and perform DLL calibration when changes in noise exceed a threshold.

For an implementation of 3DXP technology, in one embodiment, a 3DXP memory device can include mode registers such as mode register 410 to provide DLL calibration modes. The different DLL calibration modes can enable a 3DXP memory to implement power/frequency flexibility through mode registers that can be set depending on system operation. It will be understood that turning off DLL calibration can provide power saving benefits. For example, a DLL calibration can be set to turn off DLL calibration while the 3DXP memory is in low power modes because there is no bus activity that depends on proper interface signaling. It will be understood that such a case will result in lowest power level, but will increase delay while the DLL is calibrating before communication with the host/controller can be re-established.

Figure 5:
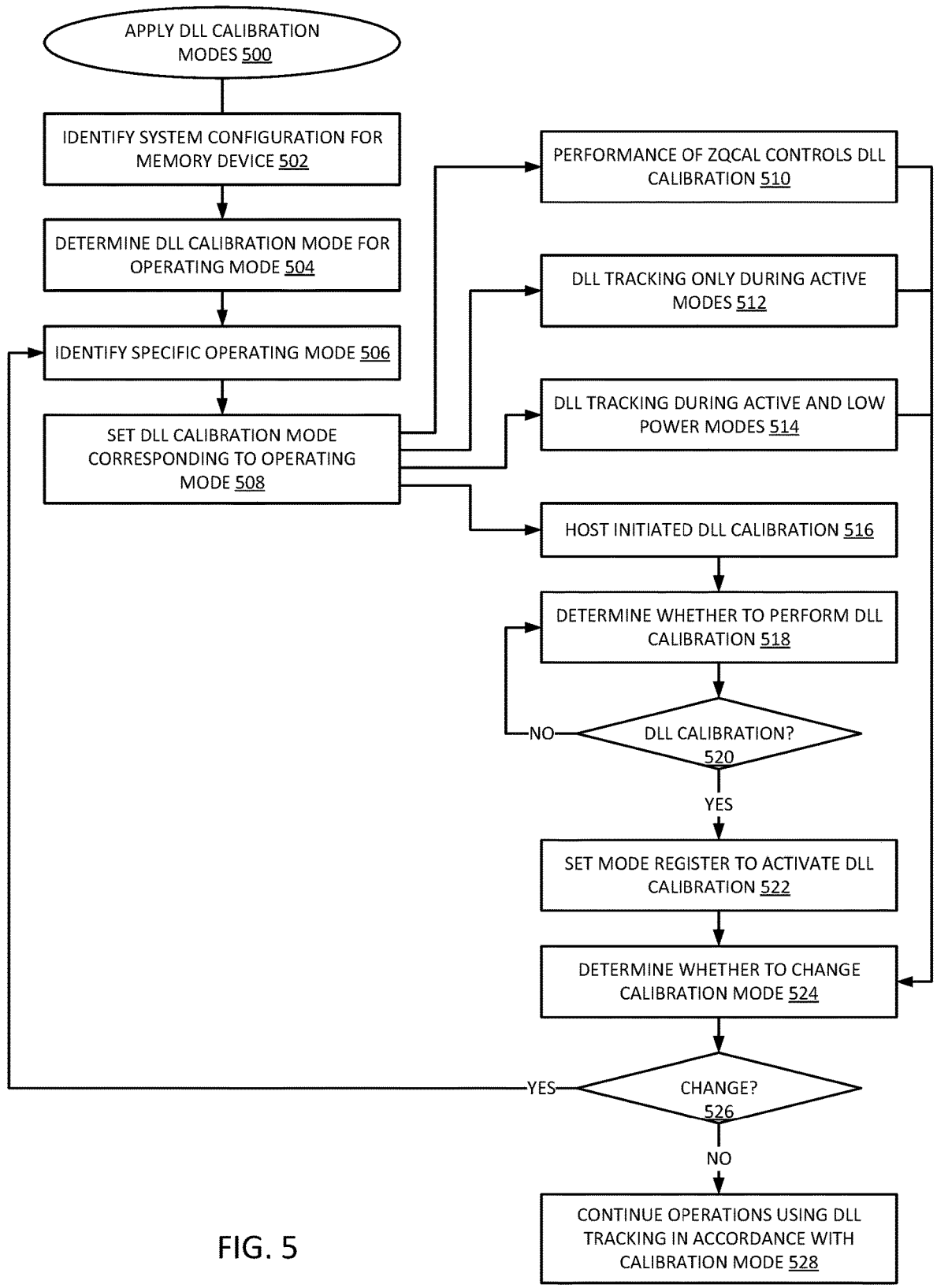
FIG. 5 is a flow diagram of an embodiment of a process for applying selective DLL calibration.

FIG. 5 is a flow diagram of an embodiment of a process for applying selective DLL calibration. More specifically, process 500 can allow the selective application of DLL calibration modes. In one embodiment, a host identifies a system configuration for an associated memory device, 502. The memory device can be any embodiment of a memory device described herein. In one embodiment, a user or system designer inputs information indicating the system configuration. In one embodiment, a BIOS (basic input/output system) discovers system configuration by polling devices. The system configuration can identify whether the memory device is configured for high speed access or only low speed access.

Based on the system configuration, in one embodiment, the host determines a DLL calibration mode for the operating mode, 504. In one embodiment, specific DLL calibration modes are associated with system configurations or operating modes or operating conditions. Such associations can be predetermined by system designers. In one embodiment, the host identifies a specific operating mode of the memory device, 506. Determining the specific operating mode can be, for example, determining when the memory device has entered or exited from a low power state. Such determining can include identifying environmental conditions for the system.

In one embodiment, the host sets the DLL calibration mode of the memory device based on the identified operating mode, 508. In one embodiment, as an example, the DLL calibration mode can include four different modes. In one embodiment, the host sets the memory to a calibration mode in which performance of impedance calibration controls the performance of DLL calibration, 510. When ZQCal performance controls the DLL calibration, it will be understood to refer to the frequency of the operations, in which DLL calibration operations are configured to occur with the same frequency as ZQCal operations.

In one embodiment, the host sets the memory to a calibration mode in which DLL tracking occurs only during active modes, 512. In one embodiment, such a mode can include active and idle modes. In one embodiment, the host sets the memory to a calibration mode in which DLL tracking occurs during active and low power modes, 514. In one embodiment, the host sets the memory a calibration mode in which DLL calibration occurs in response to host initiated commands, 516. Such commands can be separate from commands that trigger the performance of ZQCal.

With host initiated DLL calibration, in one embodiment, the host can determine whether to perform DLL calibration, 518. The host may make such a determination based on an operating state or operating condition of the memory device and/or the host system in which the memory device is disposed. In one embodiment, the host may make such a determination in accordance with one or more schedules, where certain schedules can correspond to certain operating modes of the memory device. While the host determines not to perform DLL calibration, 520 NO branch, the host can continue to monitor/wait until DLL calibration should be performed.

In one embodiment, when the host determines to cause a memory device to perform DLL calibration, 520 YES branch, the host sets a mode register to activate DLL calibration, 522. It will be understood that in a memory subsystem with multiple memory devices, the host can use the same DLL calibration schedule on all memory devices, or can cause different memory devices to apply DLL calibration at different time periods. In one embodiment, whatever DLL calibration mode is set for a memory device, the host can continue to monitor the system and determine whether to change the calibration mode, 524. It will be understood that with different calibration modes, there may be conditions that favor one calibration mode over another. In a host-initiated calibration mode, the determination of changing calibration modes can refer to selectively turning DLL calibration on or off.

If the host determines to change the calibration mode, 526 YES branch, the host can identify the specific operating mode of the memory device, 506, and set a DLL calibration mode according to the operating mode, 508. If the host determines not to change the calibration mode, 526 NO branch, in one embodiment, the system continues operations using DLL tracking in accordance with the selected/set calibration mode, 528. The memory device will continue with such DLL calibration operation while the host continues to monitor and determine if the DLL calibration mode should be changed. The memory device determines the calibration mode setting and performs DLL calibration in accordance with the DLL calibration mode. The memory device can continue to perform DLL calibration at the time interval indicated by the DLL calibration mode.

Figure 6:
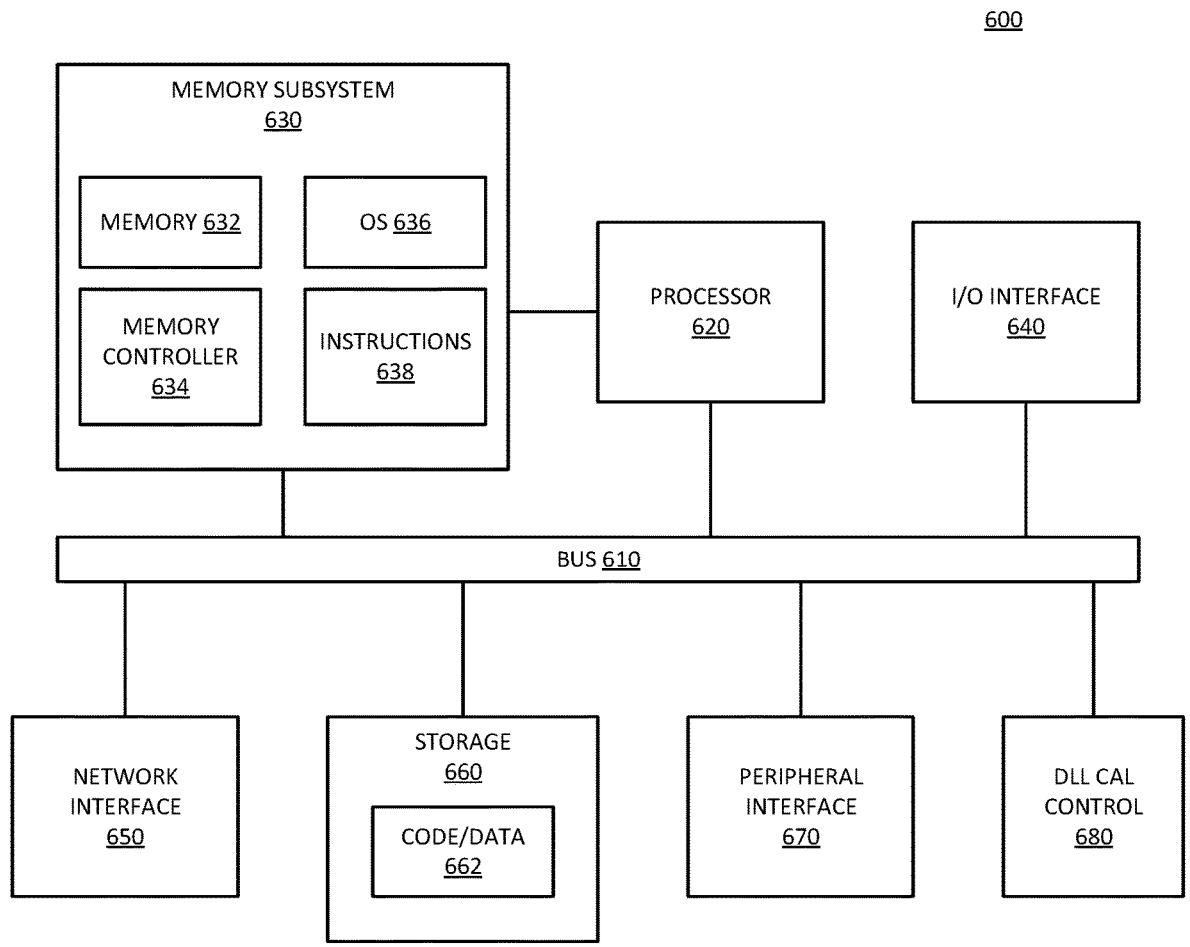
FIG. 6 is a block diagram of an embodiment of a computing system in which DLL calibration modes can be implemented.

FIG. 6 is a block diagram of an embodiment of a computing system in which DLL calibration modes can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, system 600 includes DLL calibration control 680. While shown as a separate component of system 600, it will be understood that DLL calibration control 680 can be part of one or more other systems. For example, one or more memory devices 632 can include DLL calibration control 680 in accordance with an embodiment described herein. As another example, storage 660 can include DLL calibration control 680 in accordance with an embodiment described herein. In one embodiment, system 600 includes nonvolatile memory 632, such as a three dimensional stacked memory device or a 3DXP memory device, and may not include storage 660 separate from such memory 632. DLL calibration control 680 includes or operates in accordance with configuration settings that identify a DLL calibration mode. DLL calibration control 680 supports multiple different DLL calibration modes that are dynamically configurable to provide different time intervals for operation of DLL tracking or DLL calibration operations. In one embodiment, memory 632 is a DRAM. In one embodiment, processor 620 represents one or more processors that execute data stored in one or more DRAM memories 632. In one embodiment, network interface 650 exchanges data with another device in another network location, and the data is data stored in memory 632.

Figure 7:
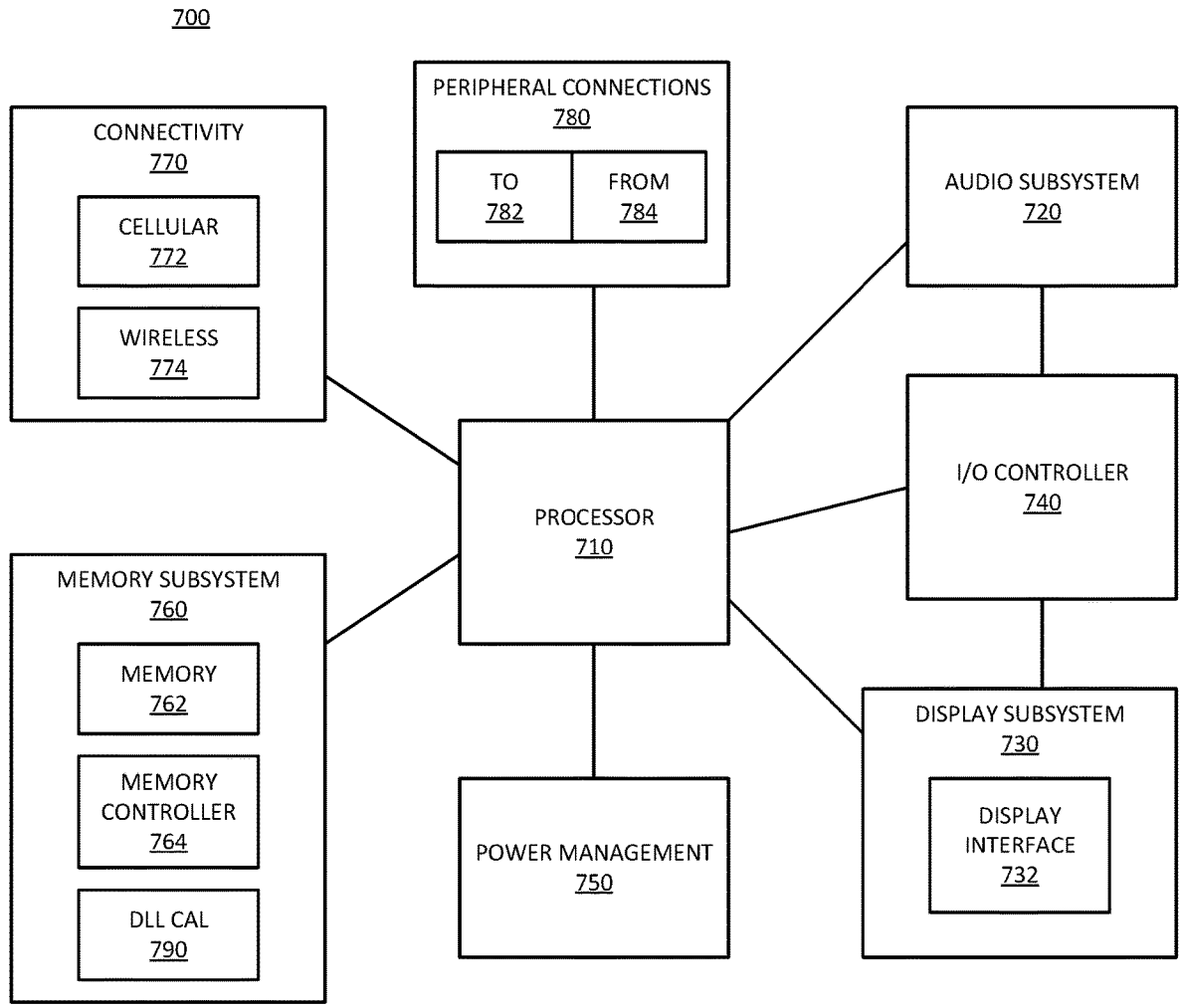
FIG. 7 is a block diagram of an embodiment of a mobile device in which DLL calibration modes can be implemented.

FIG. 7 is a block diagram of an embodiment of a mobile device in which DLL calibration modes can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 700 includes DLL calibration control 790. While shown as part of memory subsystem 760, it will be understood that DLL calibration control 680 can be part of any system that uses DLL for I/O timing control. In one embodiment, one or more memory devices 762 can include DLL calibration control 790 in accordance with an embodiment described herein. In one embodiment, memory devices 762 can include nonvolatile storage, such as a three dimensional stacked memory device or a 3DXP memory device. DLL calibration control 790 includes or operates in accordance with configuration settings that identify a DLL calibration mode. DLL calibration control 790 supports multiple different DLL calibration modes that are dynamically configurable to provide different time intervals for operation of DLL tracking or DLL calibration operations. In one embodiment, memory 762 includes a DRAM. In one embodiment, processor 710 represents one or more processors that execute data stored in one or more DRAM memories 762. In one embodiment, system 700 includes a network interface (such as in connectivity 770) to exchange data with another device in another network location, and the data is data stored in memory 762.

In one aspect, a memory device for storing data including: an input/output (I/O) interface circuit to exchange data with an associated host controller; a delay locked loop (DLL) circuit coupled to control I/O timing of the I/O interface; and a control circuit to selectively enable and disable DLL calibration for the DLL circuit in accordance with a DLL calibration mode configured for the memory device, wherein when selectively enabled, the DLL calibration to operate at a time interval identified by the DLL calibration mode, and when selectively disabled, the DLL calibration to refrain from tracking phase updates.

In one embodiment, the memory device comprises a three-dimensional (3D) stacked memory device. In one embodiment, the memory device comprises a 3D cross point (3DXP) memory device. In one embodiment, the control circuit is to selectively enable and disable the DLL calibration at runtime. In one embodiment, the DLL calibration mode comprises a host initiated calibration mode, wherein the associated host controller is to send a command to selectively enable or disable DLL calibration. In one embodiment, the associated host controller is to select a DLL calibration mode based at least in part on noise characterization for the memory device. In one embodiment, the DLL calibration mode comprises a mode in which DLL calibration is to operate continuously when the memory device is in an active operating state, and is off when the memory device is in a low power operating state. In one embodiment, the DLL calibration mode comprises a mode in which DLL calibration is to operate continuously when the memory device is in an idle operating state, and is off when the memory device is in a low power operating state. In one embodiment, the associated host controller is to select a DLL calibration mode based on an operating state of the memory device. In one embodiment, the associated host controller is to select a DLL calibration mode based on a low power state of the memory device. In one embodiment, the DLL configuration mode comprises a mode in which DLL calibration occurs in conjunction with ZQCal operation. In one embodiment, further comprising a mode register to store a configuration setting for DLL calibration mode.

In one aspect, a system with a memory subsystem including: a host controller; and a three-dimensional stacked memory device having random access capability and non-volatile storage cells, the memory device including an input/output (I/O) interface circuit to exchange data with an associated host controller; a delay locked loop (DLL) circuit coupled to control I/O timing of the I/O interface; and a control circuit to selectively enable and disable DLL calibration for the DLL circuit in accordance with a DLL calibration mode configured for the memory device, wherein when selectively enabled, the DLL calibration to operate at a time interval identified by the DLL calibration mode, and when selectively disabled, the DLL calibration to refrain from tracking phase updates. In one aspect, the system in accordance with any embodiment of the memory device as set forth above.

In one aspect, a method for controlling I/O (input/output) synchronization in a memory device including: determining from a DLL (delay locked loop) calibration mode setting of the memory device whether DLL calibration is selectively enabled or disabled for a DLL circuit coupled to control (input/output) I/O timing of an I/O interface of the memory device, wherein an associated host controller sets the DLL calibration mode; and performing DLL calibration for the DLL circuit in accordance with the DLL calibration mode, wherein when DLL calibration is selectively enabled, performing DLL calibration at a time interval identified by the DLL calibration mode, and when DLL calibration is selectively disabled, not performing DLL calibration.

In one embodiment, the memory device comprises a three-dimensional (3D) stacked memory device. In one embodiment, the memory device comprises a 3D cross point (3DXP) memory device. In one embodiment, performing DLL calibration comprises selectively enabling and disabling the DLL calibration at runtime. In one embodiment, performing DLL calibration further comprises performing DLL calibration in a host initiated calibration mode, wherein the associated host controller is to send a command to selectively enable or disable the DLL circuit. In one embodiment, performing DLL calibration is based at least in part on noise characterization for the memory device. In one embodiment, performing DLL calibration further comprises performing DLL calibration in an always on mode in which DLL calibration is continuous when the memory device is in an active operating state, and when the memory device is in a low power operating state. In one embodiment, performing DLL calibration further comprises performing DLL calibration in active on mode in which DLL calibration is continuous when the memory device is in an active operating state, and is off when the memory device is in a low power operating state. In one embodiment, performing DLL calibration further comprises performing DLL calibration in active on mode in which DLL calibration is continuous when the memory device is in an idle operating state, and is off when the memory device is in a low power operating state. In one embodiment, further comprising selecting a DLL calibration mode based on an operating state of the memory device. In one embodiment, selecting the DLL calibration mode comprises a DLL calibration mode based on a low power state of the memory device. In one embodiment, performing DLL calibration further comprises performing DLL calibration in a mode in which DLL calibration occurs in conjunction with ZQCal operation. In one embodiment, further comprising storing a configuration setting for DLL calibration mode in a mode register.

In one aspect, an article of manufacture comprising a computer readable storage medium having content stored thereon to cause execution of operations to execute a method in accordance with any embodiment of the method set forth above. In one aspect, an apparatus for memory management, comprising means for performing operations to execute a method in accordance with any embodiment of the method set forth above. Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
   a delay locked loop (DLL) circuit coupled to control timing of an I/O interface; and
   a control circuit to selectively enable calibration of the DLL circuit, and when enabled, the control circuit to select from among multiple calibration modes, including a first calibration mode to enable continuous DLL circuit tracking, and a second calibration mode in which tracking of the DLL circuit is started and stopped only in response to a command.

2. The memory device of claim 1, wherein the memory device comprises a byte-addressable resistance-based memory device.

3. The memory device of claim 1, wherein the first calibration mode is to trigger continuous DLL circuit tracking when the memory device is in an active operating state and in an idle state, and to turn off DLL circuit tracking when the memory device is in a standby state.

4. The memory device of claim 1, wherein the second calibration mode is to trigger DLL circuit tracking only in response to a command from an associated host controller.

5. The memory device of claim 1, wherein the second calibration mode is to trigger ZQCal (impedance calibration) operation to run DLL calibration.

6. The memory device of claim 1, wherein the control circuit is to selectively enable DLL calibration dynamically at runtime of the memory device.

7. The memory device of claim 1, further comprising a register to store a configuration setting to indicate the calibration mode.

8. The memory device of claim 1, wherein the control circuit is to select the first calibration mode when the I/O interface is to operate in a high frequency mode in a non-low power application.

9. The memory device of claim 1, wherein the control circuit is to select the second calibration mode when the I/O interface is to operate in a low frequency mode in a low power application.

10. A computing system, comprising:
    a host controller; and
    a three-dimensional stacked memory device coupled to the host controller, the memory device having random access capability and nonvolatile storage cells, and including
       a delay locked loop (DLL) circuit coupled to control timing of an I/O interface; and
       a control circuit to selectively enable calibration of the DLL circuit, and when enabled, the control circuit to select from among multiple calibration modes, including a first calibration mode to enable continuous DLL circuit tracking, and a second calibration mode in which tracking of the DLL circuit is started and stopped only in response to a command.

11. The computing system of claim 10, wherein the first calibration mode is to trigger continuous DLL circuit tracking when the memory device is in an active operating state and in an idle state, and to turn off DLL circuit tracking when the memory device is in a standby state.

12. The computing system of claim 10, wherein the second calibration mode is to trigger DLL circuit tracking only in response to a command from the host controller.

13. The computing system of claim 10, wherein the second calibration mode is to trigger ZQCal (impedance calibration) operation to run DLL calibration.

14. The computing system of claim 10, further comprising one or more of:
    a host processor device coupled to the memory device;
    a display communicatively coupled to a host processor;
    a network interface communicatively coupled to a host processor; or
    a battery to power the computing system.

15. A method for controlling calibration of an I/O (input/output) circuit of a memory device, comprising:
    determining from a register setting whether delay locked loop (DLL) calibration is selectively enabled to control DLL circuit tracking of a DLL circuit of the I/O circuit;
    selecting from among multiple calibration modes when DLL calibration is enabled, including selecting from among a first calibration mode to enable continuous DLL circuit tracking, and a second calibration mode in which tracking of the DLL circuit is started and stopped only in response to a command; and
    performing DLL circuit tracking in accordance with the selected calibration mode.

16. The method of claim 15, wherein performing DLL circuit tracking in accordance with the first calibration mode comprises:
- performing continuous DLL circuit tracking when the memory device is in an active operating state and in an idle state; and
- turning off DLL circuit tracking when the memory device is in a standby state.

17. The method of claim 15, wherein performing DLL circuit tracking in accordance with the second calibration mode comprises performing DLL circuit tracking only in response to a command from an associated host controller.

18. The method of claim 15, wherein performing DLL circuit tracking in accordance with the second calibration mode comprises performing DLL circuit tracking in response to ZQCal (impedance calibration) operation commands.

* * * * *